United States Patent
Boday et al.

(10) Patent No.: US 10,479,897 B2
(45) Date of Patent: Nov. 19, 2019

(54) PRODUCING AN APPARATUS BY COVERING AN ELECTRONIC COMPONENT WITH A CONFORMAL COATING CONTAINING METAL NANOPARTICLES

(71) Applicant: International Business Machines Corporation, Armonk, NY (US)

(72) Inventors: Dylan J. Boday, Tucson, AZ (US); Joseph Kuczynski, North Port, FL (US); Jason T. Wertz, Wappingers Falls, NY (US); Jing Zhang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 933 days.

(21) Appl. No.: 14/156,635

(22) Filed: Jan. 16, 2014

(65) Prior Publication Data

US 2015/0197642 A1 Jul. 16, 2015

(51) Int. Cl.
*H05K 3/00* (2006.01)
*C09D 5/10* (2006.01)
(Continued)

(52) U.S. Cl.
CPC ............... *C09D 5/10* (2013.01); *C09D 7/67* (2018.01); *C09D 7/68* (2018.01); *C09D 183/04* (2013.01); *C23F 15/00* (2013.01); *H05K 1/09* (2013.01); *H05K 1/181* (2013.01); *H05K 3/284* (2013.01); *C08K 3/015* (2018.01); *C08K 2003/085* (2013.01); *C08K 2003/0806* (2013.01); *C09D 5/084* (2013.01); *H05K 3/285* (2013.01); *H05K 2201/0215* (2013.01);

(Continued)

(58) Field of Classification Search
CPC ........ H05K 5/0091; H05K 5/065; H05K 3/28; H05K 3/282; H05K 3/284; H05K 1/181; H05K 2201/02; H05K 2201/10022; H05K 2201/09872
USPC ................................................ 427/96.2–96.6
See application file for complete search history.

(56) References Cited

U.S. PATENT DOCUMENTS 4,944,916 A * 7/1990 Franey .................... C23F 15/00
205/730
5,061,566 A 10/1991 Morgan
(Continued)

FOREIGN PATENT DOCUMENTS

CN 102424736 A 4/2012
GB 466557 5/1937
(Continued)

OTHER PUBLICATIONS

U.S. Appl. No. 14/871,870, to Boday et al., entitled "Conformal Coating Composition Containing Metal Nanoparticles to Prevent Sulfur Related Corrosion", filed Sep. 30, 2015, assigned to International Business Machines Corporation.
(Continued)

*Primary Examiner* — Brian K Talbot
(74) *Attorney, Agent, or Firm* — Matthew J. Bussan

(57) ABSTRACT

A method for producing an apparatus includes covering an electronic component with a conformal coating that includes a polymer and metal nanoparticles blended with the polymer. The electronic component is mounted on a substrate and electrically connected by metal conductors. The conformal coating overlies the metal conductors.

8 Claims, 4 Drawing Sheets

(51) Int. Cl.
*H05K 3/28* (2006.01)
*C09D 183/04* (2006.01)
*C09D 7/40* (2018.01)
*C23F 15/00* (2006.01)
*H05K 1/09* (2006.01)
*H05K 1/18* (2006.01)
*C08K 3/015* (2018.01)
*C09D 5/08* (2006.01)
*C08K 3/08* (2006.01)

(52) U.S. Cl.
CPC ............... *H05K 2201/0257* (2013.01); *H05K 2201/09872* (2013.01); *H05K 2201/10022* (2013.01); *H05K 2201/10636* (2013.01); *Y02P 70/611* (2015.11)

(56) References Cited

U.S. PATENT DOCUMENTS

| | | | | |
|---|---|---|---|---|
| 5,326,589 | A * | 7/1994 | Okinoshima | C08K 3/22 427/102 |
| 6,309,563 | B1 * | 10/2001 | Iino | H01B 1/22 252/514 |
| 6,469,090 | B1 * | 10/2002 | Azechi | H01B 1/22 428/548 |
| 6,972,249 | B2 | 12/2005 | Akram et al. | |
| 7,501,183 | B2 * | 3/2009 | Hara | C08K 3/08 428/447 |
| 7,553,901 | B2 * | 6/2009 | Horikoshi | H05K 3/285 524/266 |
| 8,241,417 | B2 | 8/2012 | Huang | |
| 8,409,627 | B2 | 4/2013 | Richardson et al. | |
| 8,486,533 | B2 | 7/2013 | Boday et al. | |
| 2004/0242762 | A1 | 12/2004 | Horikoshi et al. | |
| 2005/0059772 | A1 * | 3/2005 | Horikoshi | C09D 183/04 524/588 |
| 2005/0215706 | A1 | 9/2005 | Sakamoto et al. | |
| 2007/0257091 | A1 | 11/2007 | Kuczynski | |
| 2011/0189381 | A1 * | 8/2011 | Boday | H05K 3/284 427/58 |
| 2013/0048917 | A1 | 2/2013 | Virtanen et al. | |

FOREIGN PATENT DOCUMENTS

| | | |
|---|---|---|
| JP | 59-157160 A | 9/1984 |
| JP | 64-55389 U | 4/1989 |

OTHER PUBLICATIONS

Urbanova et al., "Room-temperature sulfidation of copper nanoparticles with sulfur yielding covellite nanoparticles", Comptes Rendus Chimie, vol. 15, Issue 6, May 22, 2012, pp. 511-516.

Jing et al., "The effect of particle size on electric conducting percolation threshold in polymer/conducting particle composite", Journal of Materials Science Letters, vol. 19, Issue 5, 2000, pp. 377-379.

* cited by examiner

PRODUCING AN APPARATUS BY COVERING AN ELECTRONIC COMPONENT WITH A CONFORMAL COATING CONTAINING METAL NANOPARTICLES

BACKGROUND

The present invention relates in general to the field of corrosion protection. More particularly, the present invention relates to a polymer conformal coating composition containing metal nanoparticles providing corrosion protection for metal surfaces against corrosion caused by environmental sulfur components.

SUMMARY

In accordance with some embodiments of the present invention, a method for producing an apparatus includes covering an electronic component with a conformal coating that includes a polymer and metal nanoparticles blended with the polymer. The electronic component is mounted on a substrate and electrically connected by metal conductors. The conformal coating overlies the metal conductors.

BRIEF DESCRIPTION OF THE SEVERAL VIEWS OF THE DRAWINGS

Embodiments of the present invention will hereinafter be described in conjunction with the appended drawings, where like designations denote like elements.

DETAILED DESCRIPTION

Figure 1:
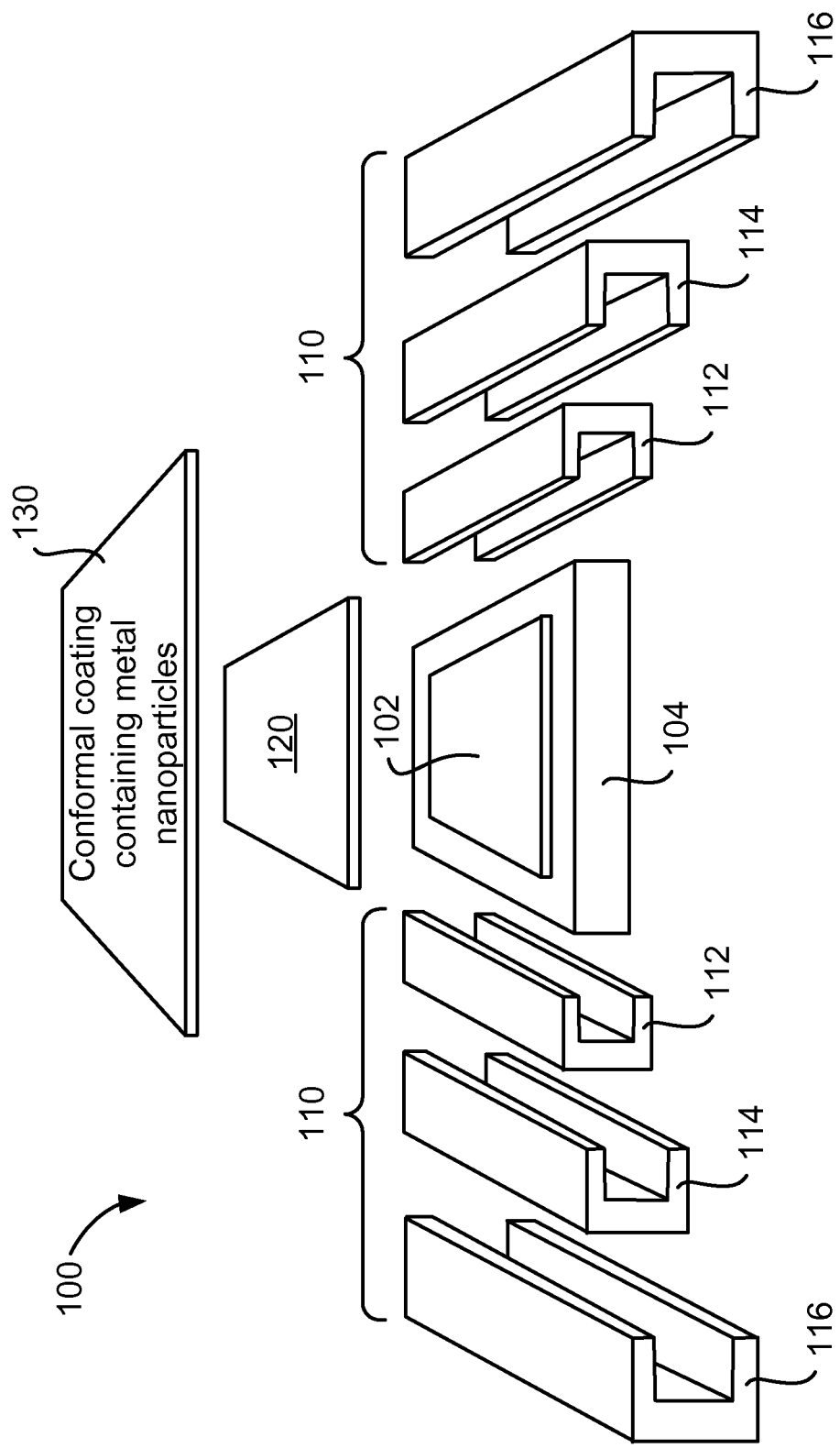
FIG. 1 is an exploded view of a gate resistor of a resistor network array that utilizes a conformal coating composition containing metal nanoparticles to protect metal conductors in accordance with some embodiments of the present invention.

The electronics industry designs and tests hardware to be able to withstand typical indoor environments. Hardware failures can occur, however, in geographies with harsher indoor environments than the design set point. This has resulted in electronic component failure due to corrosion of metallurgy via a corrosive gas environment. Attempts to mitigate these electronic component failures have focused on the use of commercially available conformal coatings. These conformal coatings fall into several generic classes: silicones, epoxies, acrylates, and other organic materials. However, accelerated aging testing has revealed that silicones may actually exacerbate the problem and that corrosion is merely retarded by the other classes of conformal coatings. Furthermore, studies have revealed sulfur components (e.g., elemental sulfur, $H_2S$, and sulfur oxides) in the gaseous environment as the major culprit. Of the sulfur components, elemental sulfur appears to be the most aggressive.

In accordance with some embodiments of the present invention, a conformal coating composition for protecting a metal surface from sulfur related corrosion includes a polymer (e.g., a commercially available conformal coating, such as Dow Corning® 1-2620 RTV Coating) and metal nanoparticles (e.g., copper nanoparticles) blended with the polymer. Copper nanoparticles, for example, added to the polymer as a filler material would react with elemental sulfur, for example, in the gaseous environment to form CuS and/or $Cu_2S$ at room temperature. This would prevent the corrosive agents from reacting with the underlying electronic component metallurgy, thus extending the product life.

The metal nanoparticles may be blended into the polymer using a high shear dispersion mixer or other suitable technique known to those skilled in the art.

Conformal coatings typically fall into several generic classes: silicones, epoxies, acrylates, and other organic materials. Hence, a conformal coating composition in accordance with some embodiments of the present invention includes a polymer that may be, for example, one or more silicone-based polymers, one or more epoxy-based polymers, one or more acrylate-based polymers, and/or one or more other organic materials; and combinations thereof. For example, the polymer may be a conventional RTV silicone rubber composition, such as Dow Corning® 1-2620 RTV Coating or Dow Corning® 1-2620 Low VOC RTV Coating. More generally, the polymer may include, but is not limited to, any suitable polysiloxane, polyepoxide, polyacrylate and/or other organic polymeric material; and combinations thereof. Typically, it is desirable for the polymer to be non-water absorbing to avoid shorting from occurring through pathways created by water. It may also be desirable for the polymer to be halogen-free (i.e., RoHS compliant).

Metal nanoparticles suitable for blending into the polymer in accordance with some embodiments of the present invention will selectively bind to elemental sulfur, thus preventing corrosion of the underlying metal structures. Suitable metal nanoparticles are sulfur-getters that prevent the target corrosive species (e.g., elemental sulfur in the air) from ever reaching the metallurgy by which the electronic component is electrically connected, thus eliminating possible corrosion. Suitable metal nanoparticles include, but are not limited to, copper nanoparticles, silver nanoparticles and nanoparticles of any other suitable metal that reacts with elemental sulfur; and combinations thereof. Copper nanoparticles, for example, will react with elemental sulfur to form CuS and/or $Cu_2S$ at room temperature. Suitable metal nanoparticles are typically high purity metal (e.g., 99.8% purity copper nanoparticles).

Suitable metal nanoparticles may have any size and shape. Typically, suitable metal nanoparticles will have an average size (diameter) within the range of approximately 5 nm to 200 nm. Smaller metal nanoparticles are usually more reactive than larger ones of the same type. Particle size also impacts the electric conducting percolation threshold, discussed below. Suitable metal nanoparticles may be spheres, plates, wires, rods, tubes, or any other shape.

Suitable metal nanoparticles are commercially available from vendors such as Sigma-Aldrich Co. LLC and SkySpring Nanomaterials, Inc.

The metal nanoparticles can be blended into the conformal coating composition as a filler material at concentrations below the electric conducting percolation threshold (typically, less than approximately 10 wt %). This percolation threshold must not be exceeded to avoid shorting of the PCB to be coated.

The electric conducting percolation threshold is related to the metal nanoparticle volume fraction in the conformal coating composition. It is known that electric conducting percolation takes place when the particle volume fraction of particles in a polymer/conducting particle composite reaches the critical volume fraction $\psi_C$. The critical volume fraction is given by the following equation:

$$\psi_C = \frac{1}{6}\pi D^3 \frac{N_C}{V}$$

wherein D is the average diameter of the conducting particles, V is the volume of the polymer/conducting particle composite, and $N_C$ is the number of conducting particles when the electric percolation takes place. See, X. Jing et al., "The effect of particle size on electric conducting percolation threshold in polymer/conducting particle composite", Journal of Materials Science Letters, Volume 19, Issue 5, 2000, pp. 377-379.

Typically, the concentration of the metal nanoparticles in the conformal coating composition is selected to provide a desired longevity (e.g., the life expectancy of a computer system in which the PCB to be coated is installed) of sulfur-gettering functionality and yet maintain levels of electrical conduction comfortably below the percolation threshold. For example, a 5 wt % loading concentration of 100 nm Cu nanoparticles in the conformal coating composition will be able to continue to react over the 7+ year life of a typical computer system.

Example (Prophetic)

0.05 g of 100 nm copper nanoparticles are blended with 1 g of Dow Corning® 1-2620 RTV Coating using a high shear dispersion mixer or other suitable technique known to those skilled in the art. Copper nanoparticles (100 nm diameter) have been shown to react quantitatively with a 1:1 atomic mass ratio of sulfur. Therefore, a conformal coating containing 0.05 g of 100 nm Cu nanoparticles can react with a maximum sulfur concentration of 0.025 g, which is substantially higher than the ppb concentration of sulfur typically present in the environment of a data center. With the low, but damaging, concentration of sulfur in a data center, the copper nanoparticles will be able to continue to react over the 7+ year life of a typical computer system.

The above-listed exemplary metal nanoparticles, polymers and concentrations are set forth for the purpose of illustration, not limitation. Those skilled in the art will appreciate that other metal nanoparticles, polymers, and/or concentrations may be used within the scope of the present invention.

In accordance with some embodiments of the present invention, an apparatus includes an electronic component mounted on a substrate, metal conductors electronically connecting the electronic component, and a conformal coating containing a polymer (e.g., a commercially available conformal coating, such as Dow Corning® 1-2620 RTV Coating) and metal nanoparticles (e.g., copper nanoparticles) overlying the metal conductors. Accordingly, the metal nanoparticle-containing conformal coating is able to protect the metal conductors from corrosion caused by sulfur components (e.g., elemental sulfur, hydrogen sulfide, and/or sulfur oxides) in the air. That is, the metal nanoparticles in the conformal coating react with any corrosion inducing sulfur component in the air and prevent the sulfur component from reacting with the underlying metal conductors.

Corrosion caused by sulfur components (e.g., elemental sulfur, hydrogen sulfide, and/or sulfur oxides) in the air is especially severe when one or more of the metal conductors that electrically connect an electronic component is/are a silver-containing metal. For example, each of the gate resistors of a resistor network array typically utilizes a silver layer at each of the gate resistor's terminations. Gate resistors are also referred to as "chip resistors" or "silver chip resistors". Typically, gate resistors are coated with a glass overcoat for corrosion protection. Also for corrosion protection, it is known to encapsulate gate resistors in a resistor network array by applying a coating of a conventional room temperature-vulcanizable (RTV) silicone rubber composition over the entire printed circuit board on which the resistor network array is mounted. However, the glass overcoat and conventional RTV silicone rubber compositions fail to prevent or retard sulfur components in the air from reaching the silver layer in gate resistors. Hence, any sulfur components in the air will react with the silver layer in the gate resistor to form silver sulfide. This silver sulfide formation often causes the gate resistor to fail, i.e., the formation of silver sulfide, which is electrically non-conductive, produces an electrical open at one or more of the gate resistor's terminations.

The use of silver as an electrical conductor for electrically connecting electronic components is increasing because silver has the highest electrical conductivity of all metals, even higher than copper. In addition, the concentration of sulfur components in the air is unfortunately increasing as well. Hence, the problem of corrosion caused by sulfur components in the air is expected to grow with the increased use of silver as an electrical conductor for electrically connecting electronic components and the increased concentration of sulfur components in the air.

Some embodiments of the present invention are described herein in the context of protecting metal conductors of an exemplary gate resistor in a resistor network array from corrosion caused by sulfur components in the air. One skilled in the art will appreciate, however, that the present invention can also apply to protecting metal conductors of gate resistors and resistor network arrays having configurations differing from the gate resistor and resistor network array shown in FIGS. 1-3 and to protecting metal conductors of other electronic components, and, more generally, to protecting a metal surface of any product. For example, the present invention can be used to protect controlled collapse chip connection (C4) solder joints that electrically connect terminals or pads on the base of a flip-chip with corresponding terminals or pads on a module substrate.

Figure 2:
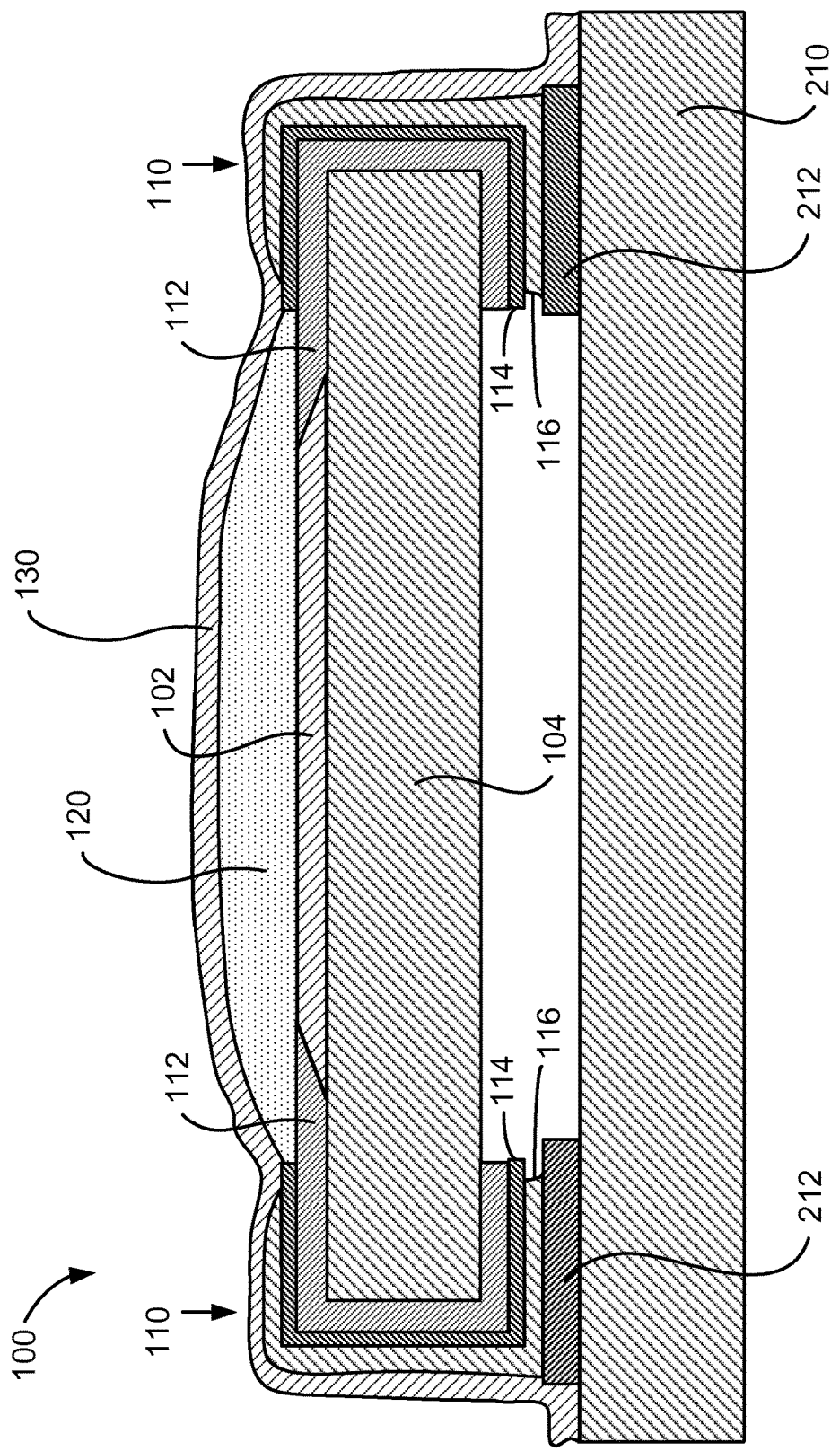
FIG. 2 is a sectional view of the gate resistor shown in FIG. 1, but which is shown mounted on a printed circuit board.
Figure 3:
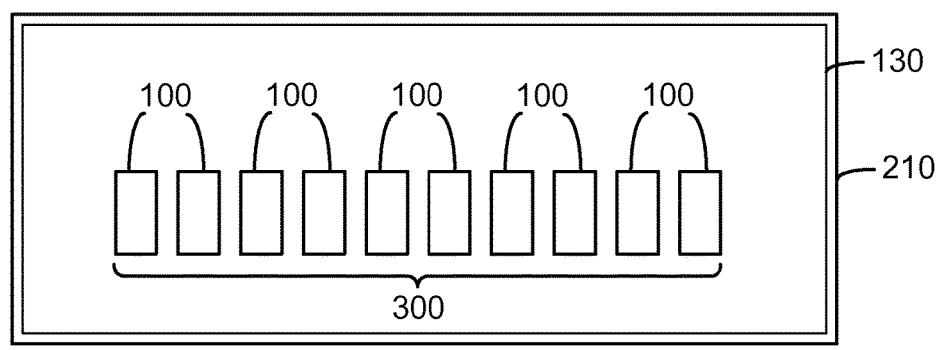
FIG. 3 is a top view of a resistor network array mounted on a printed circuit board that utilizes a conformal coating composition containing metal nanoparticles to protect metal conductors in accordance with some embodiments of the present invention.

Referring now to FIG. 1, there is depicted, in an exploded view, a gate resistor 100 of a resistor network array 300 (shown in FIG. 3) that utilizes a polymer conformal coating 130 containing metal nanoparticles, which according to the some embodiments of the present invention, provides corrosion protection for metal conductors. FIG. 2 is a sectional view of the gate resistor 100 shown in FIG. 1, but which is shown mounted on a printed circuit board 210. FIG. 3 is a top view of a resistor network array 300 that utilizes the metal nanoparticle-containing conformal coating 130 shown in FIGS. 1 and 2.

As shown in FIGS. 1 and 2, a resistor element 102 is mounted to a substrate 104, such as a ceramic substrate. The gate resistor 100 includes two termination structures 110, each typically comprising an inner Ag (silver) layer 112, a protective Ni (nickel) barrier layer 114, and an outer solder termination layer 116. Each of the termination structures 110 of the gate resistor 100 is also referred to herein as a "metal conductor".

Typically, for corrosion protection, each gate resistor in a resistor network array is coated with a conventional protective coating, such as a glass overcoat 120.

The gate resistors in a resistor network array are typically soldered to a printed circuit board by SMT (surface mounting technology) processes. As best seen in FIG. 2, the termination structures 110 of each gate resistor 100 in the resistor network array 300 (shown in FIG. 3) are soldered to corresponding terminals or pads 212 on the printed circuit board 210. For example, the outer solder termination layer 116 of the termination structures 110 of each gate resistor 100 may be reflowed to join (i.e., electrically and mechanically) the termination structures 110 on the base of the gate resistor 100 with the corresponding terminals or pads 212 on the printed circuit board 210.

As best seen in FIG. 3, in accordance with some embodiments of the present invention, the metal nanoparticle-containing conformal coating 130 covers essentially the entire printed circuit board 210, encapsulating each of the gate resistors 100 of the resistor network array 300 (as well as any other discrete electronic component(s) mounted on the board 210). Hence, the metal nanoparticle-containing conformal coating 130 overlies the metal conductors 110 of the gate resistor 100 to provide corrosion protection, i.e., the metal nanoparticle-containing conformal coating 130 protects the metal conductors 110 of the gate resistor 100 from corrosion caused by sulfur components (e.g., elemental sulfur, hydrogen sulfide, and/or sulfur oxides) in the air.

Alternatively, the metal nanoparticle-containing conformal coating 130 may cover only one or more specific areas of the printed circuit board 210 that is/are susceptible to corrosion caused by sulfur components in the air (e.g., the area of the printed circuit board 210 encompassing the resistor network array 300).

The metal nanoparticle-containing conformal coating 130 has sulfur gettering functionality which can significantly extend the product life when the gate resistor 100 (or other electronic component) is to be used in a corrosive gas environment. This benefit of some embodiments of the present invention is achieved without affecting the operation of the gate resistor 100 (or other electronic component).

Advantageously, existing deposition processes may be used for applying the metal nanoparticle-containing conformal coating 130 to the printed circuit board 210, and thereby encapsulate the resistor network array 300 and other discrete electronic component(s) mounted on the printed circuit board 210. The present invention may be implemented in any currently used conformal coating process utilized in the preparation of electronic components. Numerous processes conformally coat components with polymers. Metal nanoparticles may be blended with these polymers within the scope of the present invention. In effect, a metal nanoparticle-containing polymer conformal coating in accordance with some embodiments of the present invention replaces a conventional polymer conformal coating. Typically, there would be neither a significant change in the processing of components nor a significant change in the cost of conformally coating the components.

Moreover, one skilled in the art will appreciate that the present invention is not limited to use in the preparation of electronic components. Indeed, some embodiments of the present invention may be implemented in any currently used conformal coating process utilized in the preparation of any product (e.g., painting the metal surfaces of automobiles, appliances, road signs, etc.)

The conformal coating 130 is composed of a polymer into which metal nanoparticles are blended. The metal nanoparticles may be, for example, blended into the polymer using a high shear dispersion mixer or other suitable technique known to those skilled in the art.

The gettering functionality of the metal nanoparticles binds and traps the target corrosive species (e.g., elemental sulfur in the air). Binding this corrosive species prevents the diffusion of the corrosive species to the underlying metallurgy. If just a polymer coating was used, diffusion of the corrosive species would still occur. Polymer coatings only slow, but do not trap, the corrosive species. The metal nanoparticles, being a sulfur-getter, work by attacking the sulfur-sulfur bond in the corrosive species, breaking it and remaining covalently bonded to it. Hence the corrosive species is trapped, which prevents the further diffusion toward the surface of the electronic component. This eliminates the possibility of the corrosive species reaching the underlying metallurgical surfaces of the electronic component, and thus prevents corrosion of those metallurgical surfaces.

Preferably, the metal nanoparticles do not react with non-sulfur components in the air (e.g., carbon dioxide) which would otherwise deplete the availability of the metal nanoparticles for the target reaction (i.e., reaction with sulfur components in the air). This contrasts with enhanced RTV silicone rubber compositions known in the prior art that utilize an amino-bearing compound to prevent or retard electronic parts encapsulated or sealed therewith from corrosion with sulfur-containing gas, in which the amino-bearing compound binds not only with the sulfur components in the air but, disadvantageously, with carbon dioxide in the air. Hence, the amino-bearing compound in such prior art RTV silicone rubber compositions is quickly consumed by carbon dioxide in the air and is not available to bind with sulfur components in the air. The amino-bearing compound in such prior art RTV silicone rubber compositions also disadvantageously binds to tin catalyst, which is typically required in the formation of RTV silicone rubber compositions.

Conventional gate resistors are typically coated with an overcoat of a conventional RTV silicone rubber composition that fails to prevent or retard sulfur components in the air from reaching the inner silver layer. Hence, any sulfur components in the air will react with the inner silver layer to form silver sulfide, which is electrically non-conductive. The silver sulfide formation (often referred to as silver sulfide "whiskers") produces an electrical open at one or more of the terminations of the gate resistor and, thereby, failure of the gate resistor.

In contrast, the metal nanoparticle-containing polymer conformal coating in accordance with some embodiments of the present invention is able to protect the metal conductors from corrosion caused by sulfur components (e.g., elemental sulfur, hydrogen sulfide, and/or sulfur oxides) in the air. The metal nanoparticles in the conformal coating react with any corrosion inducing sulfur component in the air and prevent the sulfur components from reacting with the underlying metal conductors.

Figure 4:
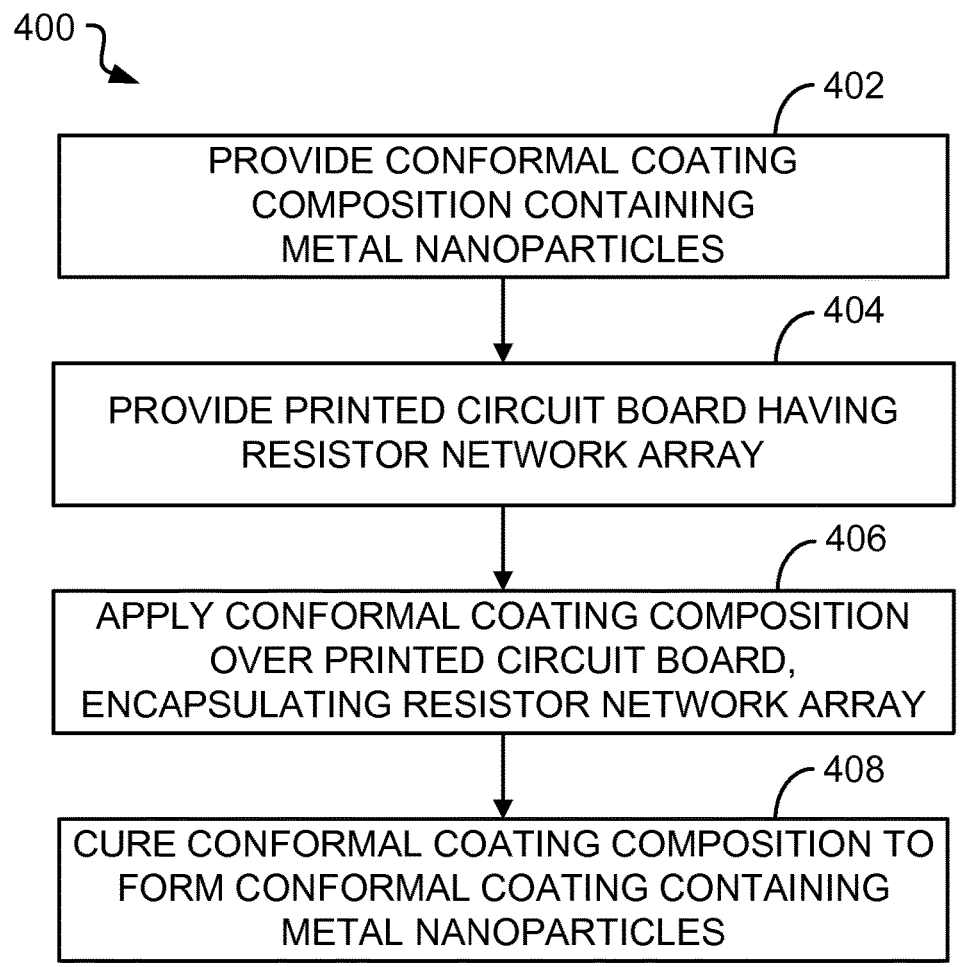
FIG. 4 is a flow chart diagram of a method for producing a resistor network array that utilizes a conformal coating composition containing metal nanoparticles to protect metal conductors in accordance with some embodiments of the present invention.

FIG. 4 is a flow chart diagram of a method 400 for producing a resistor network array that utilizes a metal nanoparticle-containing conformal coating to protect metal conductors in accordance with some embodiments of the present invention. Method 400 sets forth the preferred order of steps. It must be understood, however, that the various steps may occur simultaneously or at other times relative to one another. Method 400 begins by providing a conformal coating composition including a polymer and metal nanoparticles blended with the polymer (step 402). For example, the conformal coating composition may be prepared by blending the metal nanoparticles into the polymer using a high shear dispersion mixer.

Method 400 continues by providing a resistor network array mounted on a printed circuit board (step 404). For example, the resistor network array may include gate resistors electrically connected by silver-bearing metal conductors (e.g., termination structures each having one or more silver-containing layers). The nanoparticle-containing conformal coating composition is applied onto the printed circuit board to encapsulate the resistor network array (step 406). Preferably, the metal nanoparticle-containing conformal coating composition is applied in an at least partially uncured state by dipping, spraying, spin-coating, casting, brushing, rolling, syringe, or any other suitable deposition process. Then, the metal nanoparticle-containing conformal coating composition is cured to thereby produce the metal nanoparticle-containing conformal coating (step 408). Generally, the process used to cure the metal nanoparticle-containing conformal coating composition will vary based on the particular metal nanoparticle-containing conformal coating composition used. For example, the metal nanoparticle-containing conformal coating composition may be cured in a conventional drying process.

One skilled in the art will appreciate that many variations are possible within the scope of the present invention. For example, some embodiments of the present invention are described above in the context of protecting metal conductors of electronic devices from corrosion caused by sulfur components in the air. One skilled in the art will appreciate, however, that the present invention can also apply to preventing corrosion to any metal surface, such as the metal surfaces of an automobile. Thus, while the present invention has been particularly shown and described with reference to some embodiments thereof, it will be understood by those skilled in the art that these and other changes in form and detail may be made therein without departing from the spirit and scope of the present invention.

What is claimed is:

1. A method for producing an apparatus, comprising the steps of:
   providing an electronic component mounted on a substrate and electrically connected by metal conductors;
   applying a conformal coating composition in an at least partially uncured state over the electronic component and the substrate, wherein the conformal coating composition comprises a polymer and metal nanoparticles blended with the polymer, wherein the metal nanoparticles have an average diameter within the range of 5 nm to 200 nm, and wherein the concentration of the metal nanoparticles in the conformal coating composition is approximately 5 wt % of the conformal coating and provides a level of electrical conduction sufficiently below the electric conducting percolation threshold to avoid shorting of the electronic component and the substrate; and
   curing the conformal coating composition applied over the electronic component and the substrate to produce a conformal coating that overlies the metal conductors.

2. The method as recited in claim 1, wherein the step of applying a conformal coating composition in an at least partially uncured state over the electronic component and the substrate includes the step of applying the conformal coating composition by dipping, spraying, spin-coating, casting, brushing, rolling, and/or syringe.

3. The method as recited in claim 1, wherein the electronic component is a gate resistor of a resistor network array, and wherein the metal conductors comprise an inner silver layer of the gate resistor.

4. The method as recited in claim 1, wherein the metal nanoparticles are selected from a group consisting of copper nanoparticles and silver nanoparticles; and combinations thereof.

5. The method as recited in claim 1, wherein the metal nanoparticles include copper nanoparticles.

6. The method as recited in claim 1, wherein the metal nanoparticles have an average diameter of approximately 100 nm.

7. The method as recited in claim 1, wherein the polymer includes a room temperature-vulcanizable (RTV) silicone rubber composition.

8. A method for producing an apparatus, comprising the steps of:
   providing an electronic component mounted on a substrate and electrically connected by metal conductors;
   applying a conformal coating composition in an at least partially uncured state over the electronic component and the substrate, wherein the conformal coating composition comprises a polymer and copper nanoparticles blended with the polymer, wherein the copper nanoparticles have an average diameter of approximately 100 nm, and wherein the copper nanoparticles comprise approximately 5 wt % of the conformal coating composition; and
   curing the conformal coating composition applied over the electronic component and the substrate to produce a conformal coating that overlies the metal conductors.

* * * * *